United States Patent [19]

Kasperkovitz

[11] 3,996,478
[45] Dec. 7, 1976

[54] FREQUENCY DIVIDER FOR HIGH FREQUENCIES

[75] Inventor: Wolfdietrich Georg Kasperkovitz, Eindhoven, Netherlands

[73] Assignee: U.S. Philips Corporation, New York, N.Y.

[22] Filed: May 8, 1975

[21] Appl. No.: 575,721

[30] Foreign Application Priority Data
May 27, 1974 Netherlands ............. 7407057

[52] U.S. Cl. .................. 307/225 R; 307/291; 328/42
[51] Int. Cl.² ............................... H03K 23/08
[58] Field of Search ........... 307/225 R, 289, 291; 328/39, 42, 51

[56] References Cited
UNITED STATES PATENTS 3,681,617  8/1972  Moriyasu .................. 307/225
3,728,561  4/1973  Broeker ................ 307/225 R

*Primary Examiner*—John Zazworsky
*Assistant Examiner*—Marcus S. Rasco
*Attorney, Agent, or Firm*—Frank R. Trifari; Daniel R. McGlynn

[57] ABSTRACT

A frequency divider for high frequencies including a first and a second bistable circuit, each of which include two cross-coupled transistors, in which the common emitter circuits of the transistors of the two bistable circuits are each connected through a current source to a point of constant potential. The collectors of the transistors of the first circuit are each connected to a respective collector of each of the transistors of the second bistable circuit, and a coupling resistor is included between the collector and the base of each of the auxiliary transistors.

1 Claim, 1 Drawing Figure

U.S. Patent  Dec. 7, 1976  3,996,478
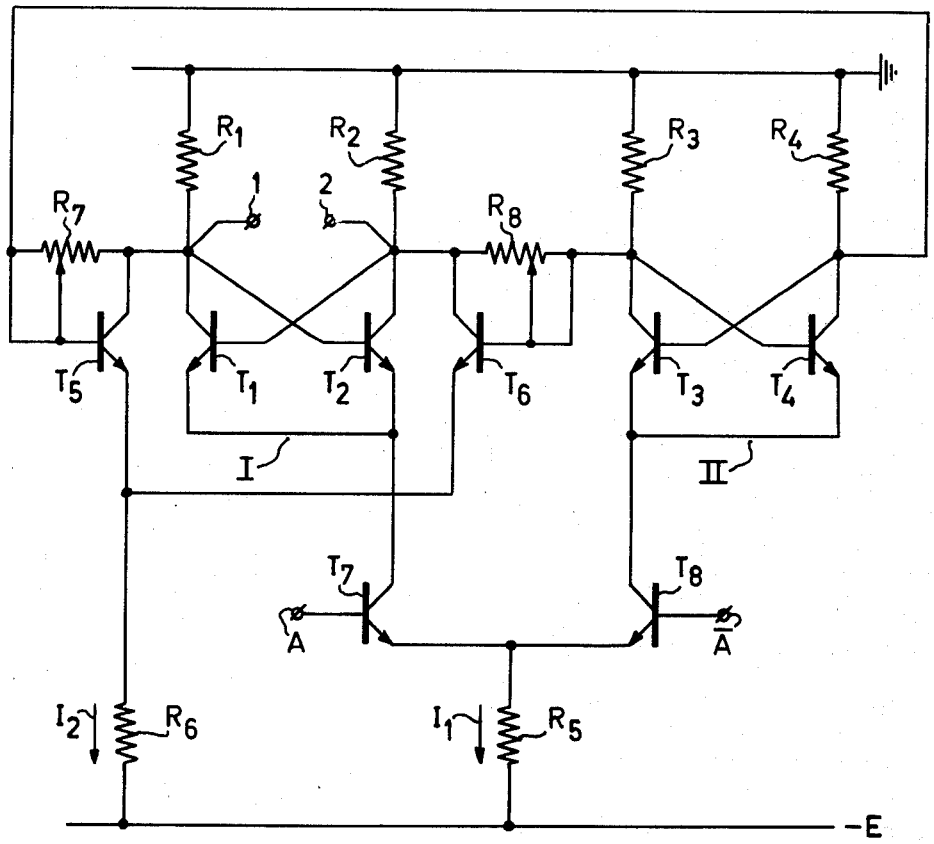

FREQUENCY DIVIDER FOR HIGH FREQUENCIES

The invention relates to a frequency divider for high frequencies, which comprises a first and a second bistable circuit, which each include two crosscoupled transistors, while the common emitter circuit of the transistors of the first bistable circuit is connected via a first current source to a point of constant potential, the common emitter circuit of the transistors of the second bistable circuit is connected via a second current source to a point of constant potential, the first and the second current source are driven by clock signals of opposite phase, the collectors of the transistors of the first bistable circuit are connected via the collector-base path of an auxiliary transistor to a collector of the transistors of the second bistable circuit, and the emitters of the auxiliary transistors are connected to a point of constant potential via a current-determining element.

Dividers of the above mentioned type are frequently employed in professional measuring equipment. Known dividers of said type often have the drawback that owing to the low efficiency of the very high frequency transistors the price of the dividers is high. Furthermore, the conventional dividers tend to become smaller and smaller, use being made of integrated elements. The object of said reduction in size is to reduce the costs and to increase the operating speed.

It is an object of the invention to provide a frequency divider, which can readily be integrated and which is moreover cheaper than the known dividers. The invention is characterized in that between the collector and the base of each of the auxiliary transistors a coupling resistor is included.

The invention will be described with reference to the drawing.

The frequency divider for high frequency in accordance with the drawing includes a first bistable circuit I and a second bistable circuit II. The circuit I comprises two cross-coupled transistors $T_1$ and $T_2$. The circuit II comprises two cross-coupled transistors $T_3$ and $T_4$. The common-emitter circuit of the transistors $T_1$ and $T_2$ of the first circuit I is connected via a first current source, constituted by the transistor $T_7$ and the resistor $R_5$, to a point $-E$ of constant potential. The common emitter circuit of the transistors $T_3$ and $T_4$ of the second circuit II is connected via a second current source, constituted by the transistor $T_8$ and the resistor $R_5$, to a point $-E$ of constant potential. The collector of the transistor $T_1$ is connected via the collector base path of the auxiliary transistor $T_5$ to the collector of the transistor $T_4$. The collector of the transistor $T_2$ is connected via the collector-base path of the auxiliary transistor $T_6$ to the collector of the transistor $T_3$. The collectors of the transistors $T_3$ and $T_4$ are connected via the respective resistors $R_3$ and $R_4$ to a point of constant potential. The collectors of the transistors $T_1$ and $T_2$ are connected via the respective resistors $R_1$ and $R_2$ to a point of constant potential. The emitters of the transistors $T_5$ and $T_6$ are connected via the resistor $R_6$ to a point $-E$ of constant potential. Between the collector and the base of the transistor $T_5$ the resistor $R_7$ is included and between the base and collector of the transistor $T_6$ the resistor $R_8$ is included. The signal to be divided is applied to the inputs A and $\overline{A}$, the signals applied to said two inputs being inverted relative to each other.

The operation of the frequency divider according to the invention is as follows. The divider in fact consists of two current-controlled bistable circuits I and II and two differential amplifiers constituted by the respective transistors ($T_5$, $T_6$) and ($T_7$, $T_8$). The differential amplifier constituted by the transistors $T_5$ and $T_6$ is employed for driving the collector of the first bistable circuit I. The differential amplifier constituted by the transistors $T_7$ and $T_8$ is used for driving the emitter of the second bistable circuit II. If the input voltage at the input A is high, the current $I_1$ flows through the transistor $T_7$ of the lower differential amplifier and energizes the bistable circuit I. The bistable circuit I consequently assumes the master state $M_1$. Via the coupling resistors $R_7$ and $R_8$ the bistable circuit II is set to the slave state $S_1$. The differential amplifier constituted by the transistors $T_5$ and $T_6$ is driven by the bistable circuit II so as to counteract the master state $M_1$ of the bistable circuit I (negative feedback). This is effected by the current $I_2$ which partly compensates for the effect of the current $I_1$ by a reduction of the difference voltage from the bistable circuit I.

When the input voltage at the input A is changed from high to low, the bistable circuit II gradually changes over from the state $S_1$ to the state $M_1$, while the bistable circuit I changes over from the state $M_1$ to the state $S_0$. The next transition of the input voltage from low to high gradually changes the state $S_0$ of the bistable circuit I to the state $M_0$ and, simultaneously by means of the coupling resistors $R_7$ and $R_8$, the state $M_1$ of the bistable circuit II changes to the state $S_0$. This means that upon each transition from high to low of the input signal at A the bistable circuit I changes over and upon each transition from low to high of said input voltage the frequency divider has reached its original state. Consequently, the frequency divider divides by two.

For obtaining very high frequencies it is necessary to partly compensate for the delay caused by the base resistor of the transistors of the differential amplifier which is constituted by the transistors $T_5$ and $T_6$. This is effected by shifting the phase of the input voltage of the differential amplifier relative to the phases of the two bistable circuits I and II by tapping the coupling resistors $R_7$ and $R_8$, as is indicated by the dotted lines in the Figure. Said frequency divider is then capable of handling frequencies of 1250 MHz.

What is claimed is:

1. A frequency divider comprising a first and a second bistable circuit, each comprising two-cross-coupled transistors,
   first and second gating transistors connecting said cross-coupled transistors of said first and second bistable circuits respectively to a point of constant potential;
   the base of said first gating transistor being connected to a first signal input, and the base of said second gating transistor being connected to a second signal input inverted relative to said first signal input;
   said first bistable circuit including a pair of auxiliary transistors, connecting the collector of each of said transistors of said first bistable circuit by means of collector-base path to a respective collector of one of said transistors of said second bistable circuit, the emitters of said auxiliary transistors being connected to a point of constant potential; and
   a coupling resistor having a tap, connected between the collector and base of each of the auxiliary transistors, said tap being connected to the base of said auxiliary transistor.

* * * * *